United States Patent
Häberle Tapia et al.

(10) Patent No.: US 11,624,114 B2
(45) Date of Patent: Apr. 11, 2023

(54) METHOD AND SYSTEM FOR PRODUCING GRAPHENE ON A COPPER SUBSTRATE BY MODIFIED CHEMICAL VAPOR DEPOSITION (AP-CVD)

(71) Applicant: Universidad Técnica Federico Santa María, Valparaíso (CL)

(72) Inventors: Patricio Häberle Tapia, Valparaíso (CL); Christian Orellana Gómez, Viña Del Mar (CL)

(73) Assignee: UNIVERSIDAD TÉCNICA FEDERICO SANTA MARÍA, Valparaíso (CL)

( * ) Notice: Subject to any disclaimer, the term of this patent is extended or adjusted under 35 U.S.C. 154(b) by 663 days.

(21) Appl. No.: 16/318,193

(22) PCT Filed: Jul. 18, 2017

(86) PCT No.: PCT/CL2017/050032
§ 371 (c)(1),
(2) Date: Jan. 16, 2019

(87) PCT Pub. No.: WO2018/014143
PCT Pub. Date: Jan. 25, 2018

(65) Prior Publication Data
US 2019/0233942 A1   Aug. 1, 2019

(30) Foreign Application Priority Data
Jul. 21, 2016 (CL) .................................. 1858-2016

(51) Int. Cl.
*C23C 16/26* (2006.01)
*C23C 16/46* (2006.01)
(Continued)

(52) U.S. Cl.
CPC ............ *C23C 16/463* (2013.01); *B82Y 30/00* (2013.01); *B82Y 40/00* (2013.01); *C23C 16/26* (2013.01);
(Continued)

(58) Field of Classification Search
None
See application file for complete search history.

(56) References Cited

U.S. PATENT DOCUMENTS 7,828,898 B2    11/2010 Ricoh
2013/0174968 A1  7/2013 Vlassiouk et al.
(Continued)

FOREIGN PATENT DOCUMENTS

WO    2014038803 A1    3/2014
WO    2018014143 A1    1/2018

OTHER PUBLICATIONS

Written Opinion of the International Searching Authority, PCT/CL2017/050032, dated Nov. 13, 2017.
(Continued)

*Primary Examiner* — Joel G Horning
(74) *Attorney, Agent, or Firm* — Procopio, Cory, Hargreaves & Savitch LLP (57) ABSTRACT

A method and system for producing graphene on a copper substrate by modified chemical vapor deposition (AP-CVD), comprising arranging two copper sheets (40) in a parallel manner and separated by a ceramic material (30, placing said two copper sheets (40) inside an open chamber consisting of a glass chamber (10), heating the two copper sheets (40) to a predetermined temperature by using an electromagnetic induction heater (20), supply a mixture of methane and argon flows to the upper face (18) of said glass cylindrical chamber (10), continually monitoring the temperature of the two copper sheets (40), heating to about
(Continued)

1,000° C. for a predetermined period of time using the electromagnetic induction heater (20), and cooling to room temperature under the same methane and argon flows.

16 Claims, 6 Drawing Sheets

(51) Int. Cl.

| | | |
|---|---|---|
| *B82Y 40/00* | (2011.01) | |
| *H01L 21/00* | (2006.01) | |
| *B82Y 30/00* | (2011.01) | |
| *H01L 21/02* | (2006.01) | |
| *C23C 16/54* | (2006.01) | |
| *C23C 16/44* | (2006.01) | |
| *H01L 21/285* | (2006.01) | |

(52) U.S. Cl.
CPC .............. *C23C 16/44* (2013.01); *C23C 16/46* (2013.01); *C23C 16/54* (2013.01); *H01L 21/00* (2013.01); *H01L 21/02* (2013.01); *H01L 21/285* (2013.01)

(56) References Cited

U.S. PATENT DOCUMENTS

| | | |
|---|---|---|
| 2014/0017160 A1 | 1/2014 | Song et al. |
| 2015/0140211 A1* | 5/2015 | Strobl ................ C23C 16/4404 118/725 |
| 2015/0225844 A1 | 8/2015 | Van Baarle et al. |

OTHER PUBLICATIONS

D2: Piner, D. et al. Graphene Synthesis via Magnetic Inductive Heating of Copper Substrates. ACS Nano, 2013, 7 (9), pp. 7495-7499 001: 10.1021/nn4031564. [en linea] [Retrieved the Jun. 11, 2017] Recovered from <http://utw10193.utweb.utexas.edu/Archive/RuoffsPDFs/359.

D3: Memon, N. et al. Flame synthesis of graphene films in open environments. Carbon vol. 49, Issue 15, Dec. 2011, pp. 5064-5070. https://doi.org/10.1016/j.carbon.2011.07.024. [en linea] [Retrieved theJun. 11, 2017] Recovered from.

D8: Seifert, M. et al. Induction heating-assisted repeated growth and electrochemical transfer of graphene on millimeter-thick metal substrates. Diamond and Related Materials vol. 47, Aug. 2014, pp. 46-52. https://doi.org/10.1016/j.diamond.2014.05.007. [en linea].

International Search Report, PCT/CL2017/050032, dated Nov. 13, 2017.

* cited by examiner

METHOD AND SYSTEM FOR PRODUCING GRAPHENE ON A COPPER SUBSTRATE BY MODIFIED CHEMICAL VAPOR DEPOSITION (AP-CVD)

APPLICATION SCOPE

The present invention refers to producing graphene on copper at atmospheric pressure by modified chemical vapor deposition (AP-CVD). More particularly, a method and system for producing graphene on a copper substrate by modified chemical vapor deposition (AP-CVD) are provided.

DESCRIPTION OF THE PRIOR ART

Today, forming graphene by chemical vapor deposition presents excellent results in terms of the synthesized graphene's quality, costs, and scalability.

The invention Patent Application US2013217222 dated Aug. 22, 2013, entitled "Large-Scale Graphene Sheet: Articles, Compositions, Methods and Devices Incorporating Same"", Johnson et al., describes methods for growing large-size, uniform graphene layers on planarized substrates using Chemical Vapor Deposition (CVD) at atmospheric pressure (AP); graphene produced according to these methods may have a single layer content of 95% or less. Field effect transistors fabricated by the procedure of the invention have room temperature hole mobilities that are a factor of 2-5 larger than those measured for samples grown on commercially-available copper foil substrates.

The Invention Patent Application WO2014174133 dated Oct. 30, 2014, entitled "Method for the Controlled Production of Graphene Under Very Low Pressure and Device for Carrying Out Said Method," Bertram Serra Enric et al., describes a method and a device for preparing a graphene structure of 1-5-layer, controlling the number of layers, by means of a chemical vapor deposition (CVD) method on a pre-determined substrate, at the vacuum pressure of 10-4-10-5 Pa, the temperature being at between 500-1050° C., based on using a precursor carbon gas with a synchronized sequence of pulses. Each pulse has a specific escape time for the precursor gas, as a result of the pumping, the pressure pulse consisting of an instantaneous pressure increase as a result of the instantaneous opening of a valve, followed by an exponential pressure decrease, the number of pulses depending on the quantity of layers and the time between pulses depending on the specific escape time of the precursor carbon gas.

The Invention Patent Application WO2012031238, dated 3 Aug. 2012, titled "Uniform Multilayer Graphene by Chemical Vapor Deposition," Zhoug Zhaohui et al., describes a method for producing uniform multilayer graphene by chemical vapor deposition (CVD). The method is limited in size only by CVD reaction chamber size and is scalable to produce multilayer graphene films on a wafer scale that have the same number of layers of graphene throughout substantially the entire film. The uniform bilayer graphene may be produced by using a method that does not require assembly of independently produced single layer graphene. The method includes a CVD process wherein a reaction gas is flowed in the chamber at a relatively low pressure compared to conventional processes and the temperature in the reaction chamber is thereafter decreased relatively slowly compared to conventional processes.

Every cited document fail to describe or teach a method and system for forming high-quality SLG (Single Layer Graphene) and BLG (Bilayer Graphene) on copper substrate by chemical vapor deposition (CVD) as carried out in open-chamber conditions with no hydrogen addition and in a single step by a substrate configuration which is constituted by two parallel copper sheets that break the methane between them down as they are heated via electromagnetic induction at about 1000° C.

SUMMARY OF THE INVENTION

A first object of the invention is a method for producing graphene on a copper substrate by modified chemical vapor deposition (AP-CVD), comprising:
  providing two copper sheets arranged in a parallel manner and separated by a ceramic material;
  incorporating said two copper sheets into an open chamber that is constituted by a glass cylindrical chamber, wherein its axial axis is directed vertically, wherein the glass cylindrical chamber is totally open in its lower surface;
  heating the two copper sheets by using an electromagnetic induction heater at a predetermined temperature;
  providing a mixture of Methane and Argon streams in the upper surface of said glass cylindrical chamber;
  continually monitoring the temperature of the two copper sheets by using a radiation pyrometer through a quartz window arranged in the upper surface of the glass cylindrical chamber;
  heating to about 1000° C. by using an electromagnetic induction heater for a predetermined period of time; and cooling down to room temperature with the same Methane and Argon streams.

Wherein the predetermined temperature to heat the two copper sheets arranged in a parallel manner and separated by a ceramic material by using the electromagnetic induction heater is 1000° C. And the two circular copper sheets, arranged inside the glass cylindrical chamber, have 30 mm diameter, and 0.1 mm thickness with 99.8% purity, and are located in a parallel, separated manner, and supported by three ceramic pillars of 3.5 mm diameter and 30 mm long, that are fixed to a base also made of the same material. The electromagnetic induction heater consists of a coil, preferably of 2.5 μmH, that externally rolls up at the glass cylindrical chamber, wherein alternate current as generated by a frequency oscillator, preferably at 250 KHz, is fed to the coil. Prior to their introduction into the glass cylindrical chamber, the two copper sheets are treated with acetic acid for 2 minutes, and are rinsed with ethanol. Additionally, the copper sheets are kept under Methane and Argon streams of 1.0 L/min and 0.1 L/min, respectively, for 2 minutes, and are cooled down with the same Methane and Argon streams with a cooldown reduction of 1000° C. to 600° C. in about 5 seconds. The predetermined period of time for heating to about 1000° C. by using an electromagnetic induction heater is 15 minutes. The material of the glass cylindrical chamber is preferably Pyrex, with 40 mm diameter and 110 mm long.

A second object of the invention is a system for producing graphene on a copper substrate by modified chemical vapor deposition (AP-CVD), comprising two copper sheets arranged in a parallel manner and separated by a ceramic material; said two copper sheets incorporated into an open chamber that is constituted by a glass cylindrical chamber, wherein its axial axis is directed vertically, wherein the glass cylindrical chamber is totally open in its lower surface; an electromagnetic induction heater at a predetermined temperature to heat the two copper sheets and for a predetermined period of time; a provision of a mixture of Methane and Argon streams in the upper surface of said glass cylindrical chamber; and a radiation pyrometer to continually monitoring the temperature of the two copper sheets through a quartz window arranged in the upper surface of the glass cylindrical chamber.

DESCRIPTION OF A PREFERRED EMBODIMENT

In the state of the art, graphene is synthesized by CVD under different pressure conditions, such as LP (low pressure)-CVD and HP (high pressure)-CVD. For AP (ambient pressure)-CVD, vacuum systems and pumps, chamber emptying and filling cycles with a noble gas are necessary since atmospheric oxygen present in the synthesis gases and the substrate, such as native oxides, have a tendency to damage and inhibit the formation of graphene. Thus, multiple steps (heating, growing, and cooling down) in the graphene synthesis are to be taken due to adding hydrogen gas in different amounts as a reducing agent and co-catalyst.

In contrast, in the present invention the graphene synthesis is developed in a single step in an open chamber without adding hydrogen gas by using only argon and methane. Additionally, by the end of the synthesis, the conditions for a new graphene growing process are quickly met by the system.

The present invention produces graphene by a novel substrate configuration which is constituted by two copper sheets (40) arranged in a parallel manner and separated by a ceramic material (30) which are heated via electromagnetic induction (20) at a temperature pf 1000° C. The gap formed between the sheets, or interface zone, retains the breaking down species, hydrogen, and intermediate species which inhibit the action of the residual oxygen and reduces the native oxide from the Cu surface in that zone. Additionally, these species bring about the carbon adsorption thus causing the growth of graphene in the sheets' inner surfaces.

All this allows to reducing production costs by saving energy and synthesis gases, as well as to reducing difficulties in the handling of explosive gases such as hydrogen. The production scalability to industrial level is facilitated by the invention.

Figure 1:
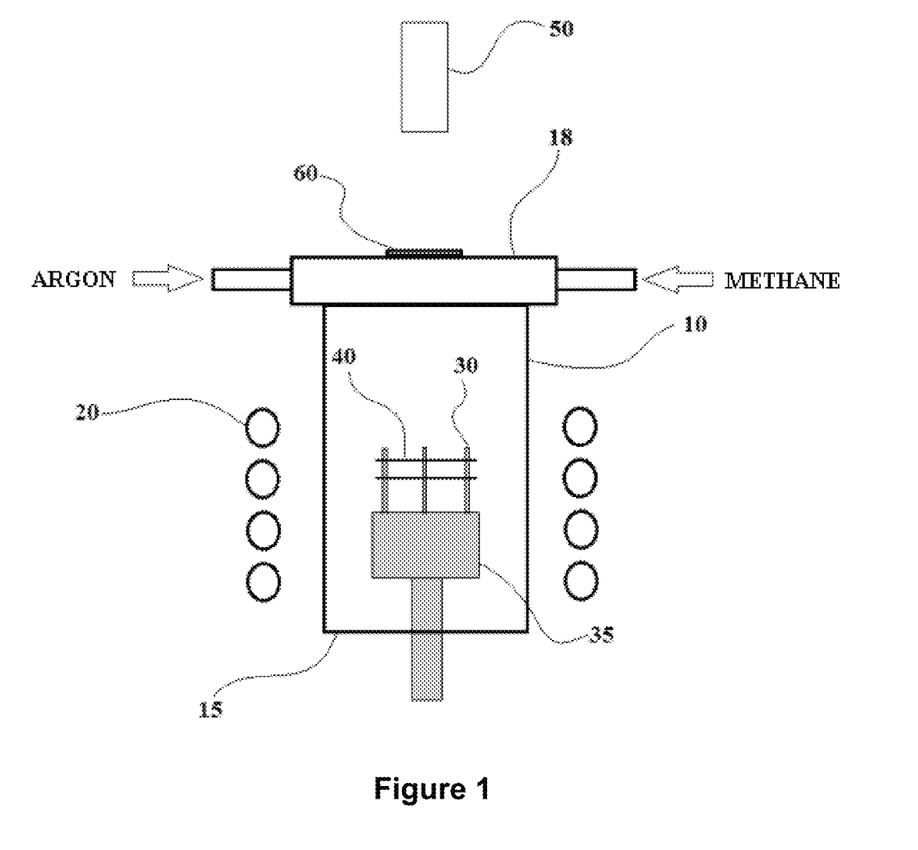
FIG. 1 describes a scheme of the system of the present invention.

The system for producing graphene (100) in open chamber AP-CVD as shown in the FIG. 1 is made up by a glass cylindrical chamber (10), preferably Pyrex with 40 mm diameter and 110 mm long, wherein its axial axis is directed vertically, the glass cylindrical chamber (10) being totally open in its lower surface (15) and its upper surface (18), is fed with a mixture of Methane and Argon.

Inside the glass cylindrical chamber (10), two circular copper sheets (40), of 30 mm diameter and 0.1 mm thickness with 99.8% purity, are arranged in a parallel, separated manner, and supported by three ceramic pillars (30), of 3.5 mm diameter and 30 mm long, that are fixed to a base (35) also made of the same material.

The two copper sheets (40) are heated via electromagnetic induction by using an electromagnetic induction heater (20) consisting of a coil, preferably of 2.5 µmH, that externally rolls up at the glass cylindrical chamber (10), wherein the electromagnetic induction heater (20) coil is fed by an alternate current as generated by a frequency oscillator (not shown), preferably equal to 250 KHz. This frequency is set due to the high electric conductivity of the circular copper sheets (40).

The temperature of the two copper sheets (40) is continually monitored by a radiation pyrometer (50) through a quartz window (60) arranged on the upper surface (18) of the glass cylindrical chamber (10), thus making it possible to control the temperature by the power supply to the electromagnetic induction heater (20).

Prior to their introduction into the glass cylindrical chamber (10), the two copper sheets (40) are treated with acetic acid for 2 minutes and rinsed with ethanol. Thus, the cooper sheets (40) are kept in the glass cylindrical chamber (10) under Methane and Argon streams of 1.0 L/min and 0.1 L/min, respectively, for 2 minutes. Subsequently they are heated to about 1000° C. by using an electromagnetic induction heater (20) for 15 minutes. By the end of this step, they are left to cool down to room temperature with the same Methane and Argon streams, thus attaining a cooling down of 1000° C. to 600° C. in about 5 seconds.

From this configuration of two copper sheets (40) arranged in a parallel manner and separated by a ceramic material (30) which are heated via electromagnetic induction at a temperature of 1000° C. The gap formed between the copper sheets (40) and the chamber sets a marked thermal gradient that has a tendency to separate the gases based on its molecular weight in the gradient direction. Such thermal diffusion allows for the lighter molecules (methane and others from the breaking down) to be directed to the highest temperature zone, the interface zone, while the heaviest ones (Ar, $O_2$, N) stay out of this zone. Thus, oxygen, being harmful for growing graphene, tends to go out the interface zone. Additionally, the residence of methane and the breaking down species in this zone is higher in the outer surfaces, thus resulting in a higher collision density with the sheets and increasing the probability for the breaking down of methane.

On the other hand, breaking down products, hydrogen, and intermediate species inhibit the action of residual oxygen and reduce the native oxide from the copper sheets' (40) inner surfaces. Additionally, these species bring about the carbon adsorption in the sheets' inner surfaces, thus causing the growth of graphene in said surfaces.

The Raman spectroscopy is a powerful, non-destructive technique widely used for identifying and characterizing graphene and carbon-based materials. The highlighted characteristics in the Raman spectrum for graphene are the D~1350 cm$^{-1}$, D*~1622 cm$^{-1}$, G~1580 cm$^{-1}$, and 2D~2700 cm$^{-1}$ bands. The G band is related to the stretching movement of the sp2 linkages. The D and D* bands are associated to induced defect. Lastly, the 2D band, which is an overtone of the D band, is useful to specify the number of graphene layers. The ratio between D/G intensities is widely used in order to characterize the graphene defects. Additionally, the 2D/G ratio intensities is a measure for the number of graphene layers. For monolayer graphene, the ratio is higher than 2.

The graphene formed according to the present invention is identified and characterized by using a Raman spectrometer at wavelengths of 514, 532, and 647 nm.

Figure 2:
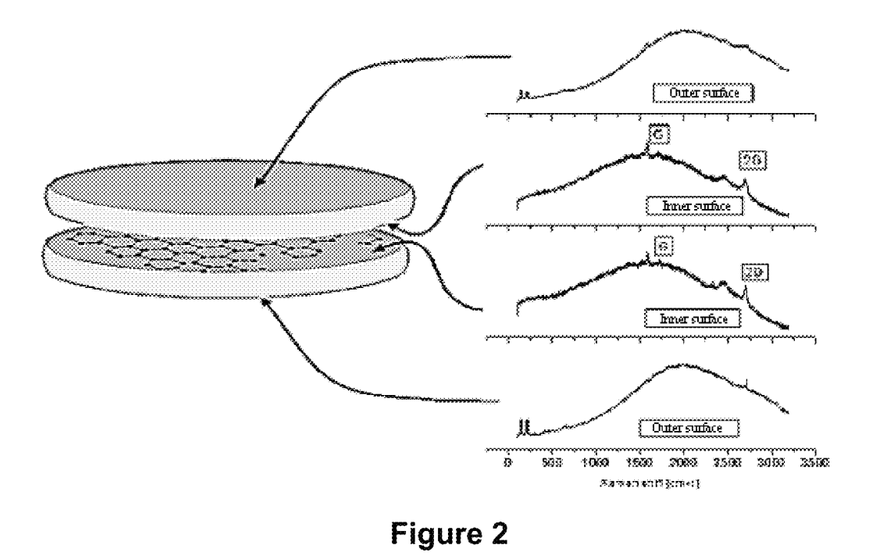
FIG. 2 describes a copper sheet arrangement for the graphene synthesis of the present invention, with the 532-nm Raman spectra being obtained directly on the inner and outer surfaces of the copper sheets from the synthesis of the present invention.

FIG. 2 describes the Raman spectra directly obtained from the two copper sheets' (40) inner surfaces. The typical monolayer and bilayer graphene spectra with absence of D band, as shown in the graphs, are observed, thus indicating high-quality graphene growth and absence of D* band associated to nitrogen doping. However, in the sheets' outer surfaces, the spectra show amorphous carbon formation and peaks associated to copper oxides such as the 218 cm$^{-1}$ and 540 cm$^{-1}$ peak.

Figure 3:
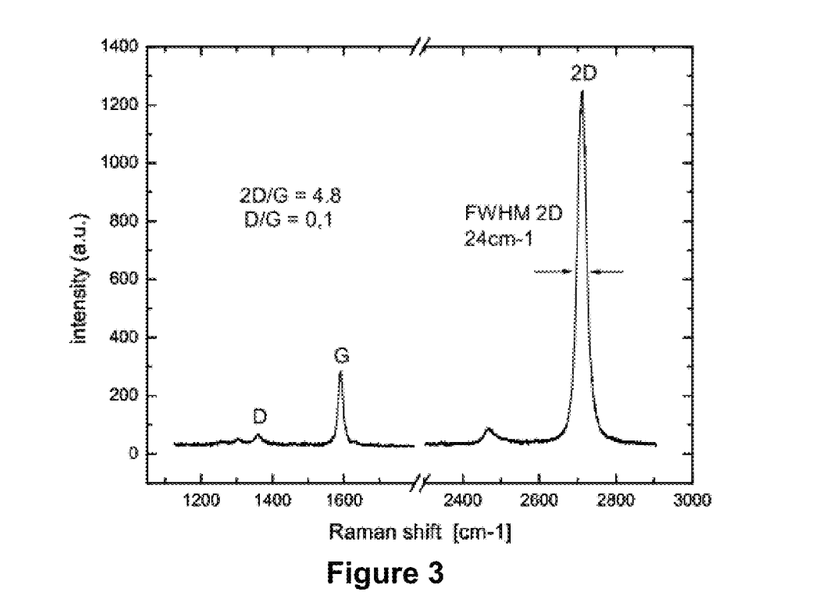
FIG. 3 describes the 514-nm Raman spectrum of graphene grown on one of the copper sheet inner surface.

FIG. 3 shows a micrograph of the graphene surface as transferred to a SIO$_2$/Si substrate which is synthesized at 970° C. for 15 minutes with a gap distance between the two copper sheets (40) of 1 mm; Raman spectra obtained show a 2D/G ratio of more than 4. Also, the FWHM of the 2D peak is about 24 cm$^{-1}$; therefore, a monolayer graphene growth is inferred. The D/G ratio is about 0.1.

Figure 4:
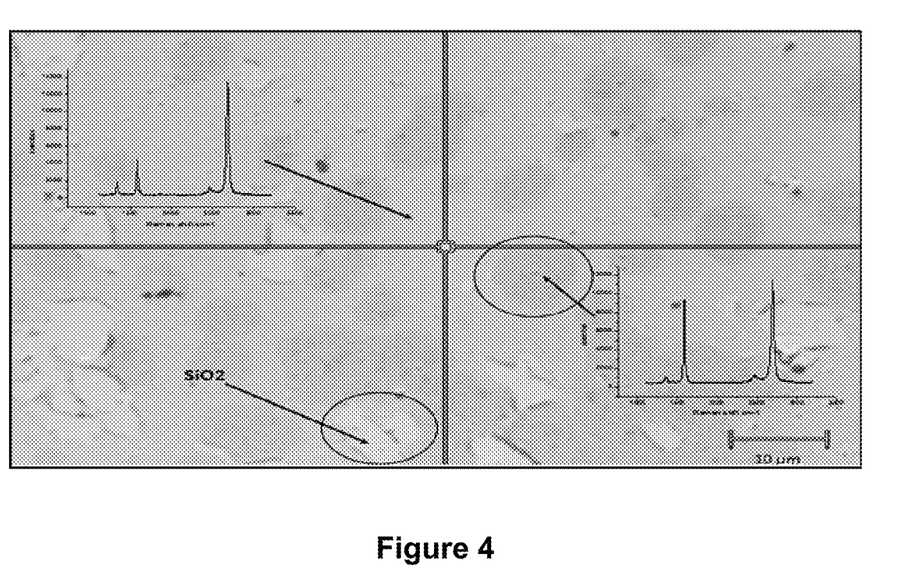
FIG. 4 describes micrographs of graphene as transferred into silicon oxide, wherein graphene mono and bilayer regions based on 532-nm Raman spectra are observed.

FIG. 4 shows a micrograph of the graphene surface as transferred to a SIO$_2$/Si substrate, with monolayer and bilayer graphene regions being noticed based on its Raman spectra in the insert.

Figure 5:
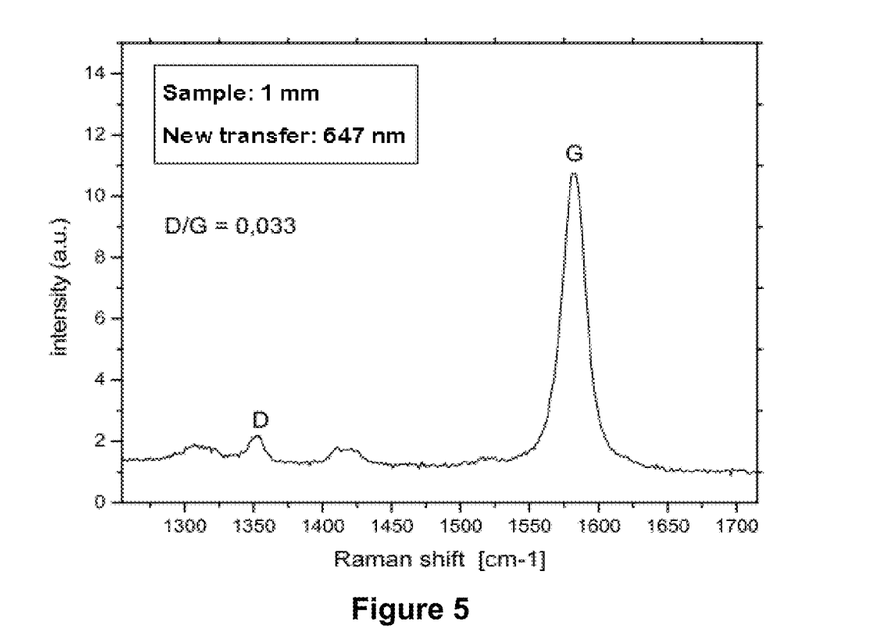
FIG. 5 describes Raman spectra with a 647-nm wavelength of graphene as grown on one of the copper sheet inner surface, and transferred over a $SiO_2$/Si substrate.

FIG. 5 shows the Raman spectrum in wavelengths of 647 nm on graphene as transferred to a SIO$_2$/Si substrate with a D/G ratio ~0.03, thus indicating high-quality graphene.

Figure 6:
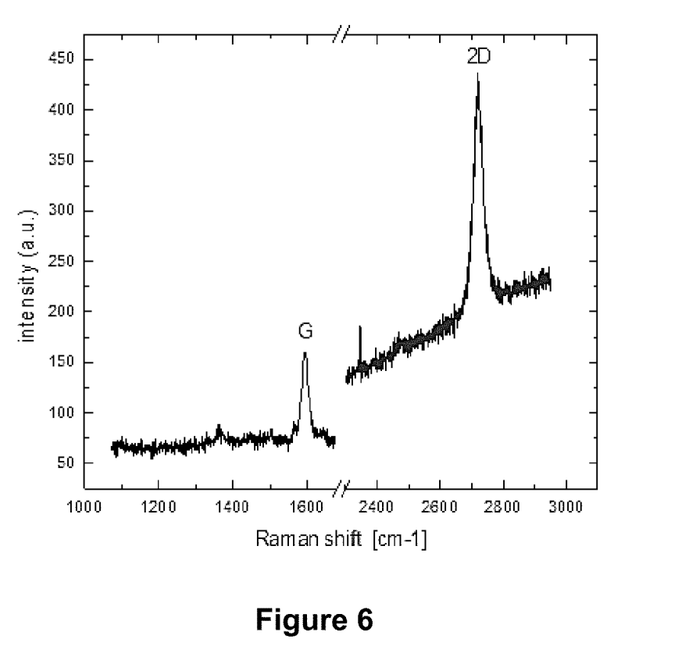
FIG. 6 describes the 488-nm Raman spectrum of graphene on one of the copper sheet inner surface.

FIG. 6 shows the typical graphene Raman spectrum obtained directly on one of the copper sheets in the interface zone by using a Raman spectrometer at 514 nm.

Figure 7:
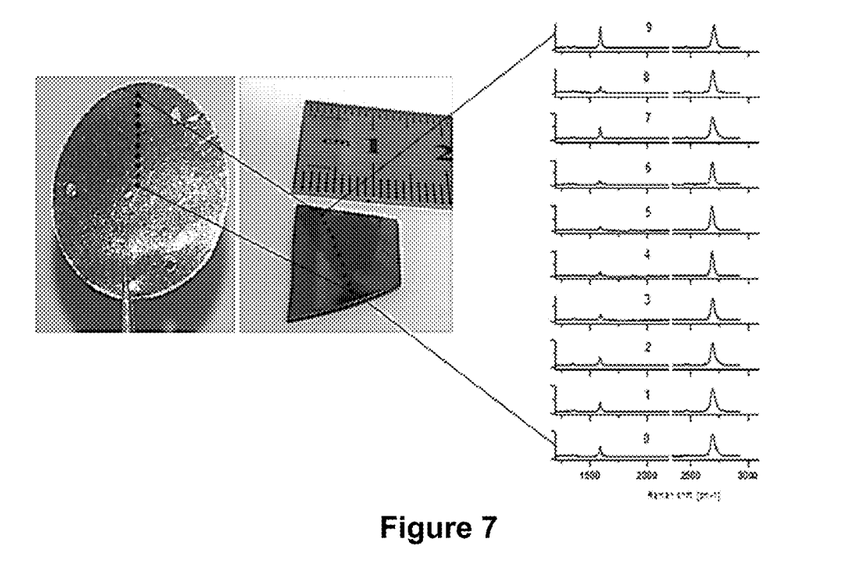
FIG. 7 describes the 514-nm Raman spectrum of graphene as grown on one of the copper sheet inner surface, and transferred over $SiO_2$/Si in ten different points of the substrate radially.

FIG. 7 shows the photograph of one of the sheets exposed to the synthesis in its inner surface. Then the grown graphene is transferred to a SIO$_2$/Si substrate, wherein the Raman spectra were obtained from ten different locations in radial direction.

Figure 8:
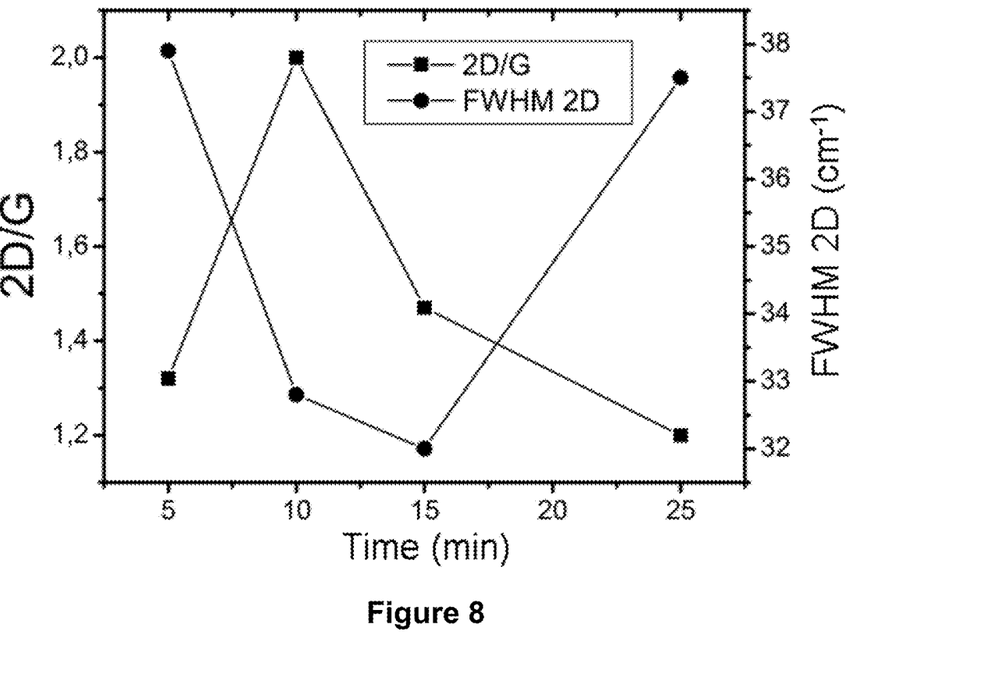
FIG. 8 shows the time-of-exposure variation of the sheets as a function of 2D/G and Full Width at Half Maximum (FWHM).

FIG. 8 shows the exposure time variation in the sheet as a function of 2D/G and FWHM, wherein the synthesis parameters are as follows: gap distance between sheets of 1 mm, temperature of 970° C., and flow rates of 1 and 0.1 L/min Argon and Methane, respectively. The 532-nm Raman spectra are obtained directly in one of the copper sheets' inner surface in nine different locations, thus its respective 2D/G, D/G, and FWHM ratios being obtained to finally be averaged, thus an optimal synthesis time of about 15 min being observed.

Figure 9:
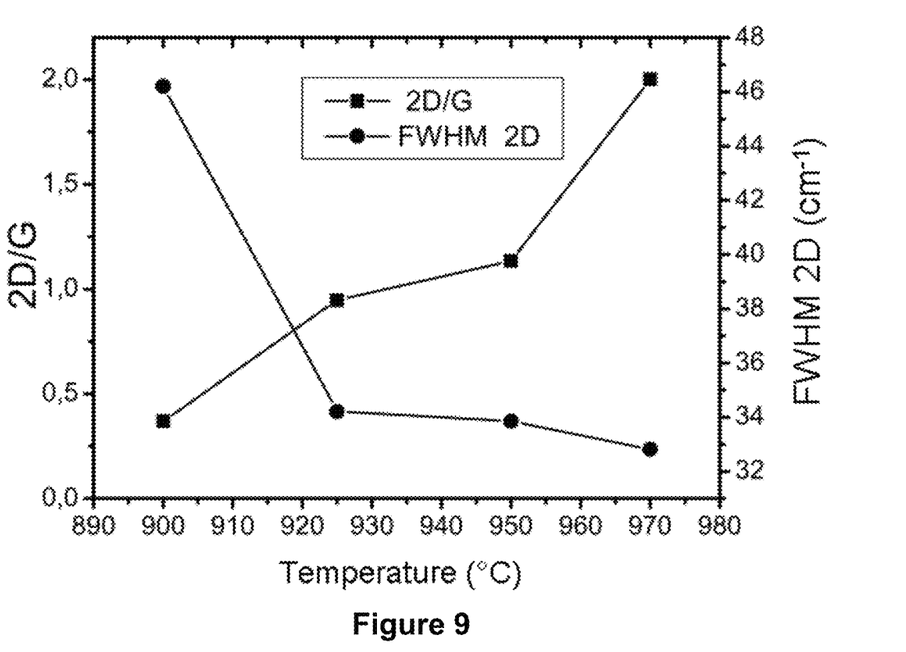
FIG. 9 shows the temperature variation as a function of FWHM 2D/G.

FIG. 9 shows the temperature variation as a function of 2D/G and FWHM, wherein the synthesis parameters are as follows: exposure time of 10 min, gap distance between sheets of 1 mm, and flow rates of 1 and 0.1 L/min Argon and Methane, respectively. The 532-nm Raman spectra are obtained directly in one of the copper sheets' inner surface in nine different locations, thus its respective 2D/G, D/G, and FWHM ratios being obtained to finally be averaged. Thus, an optimal synthesis temperature of 970° C. is observed.

Figure 10:
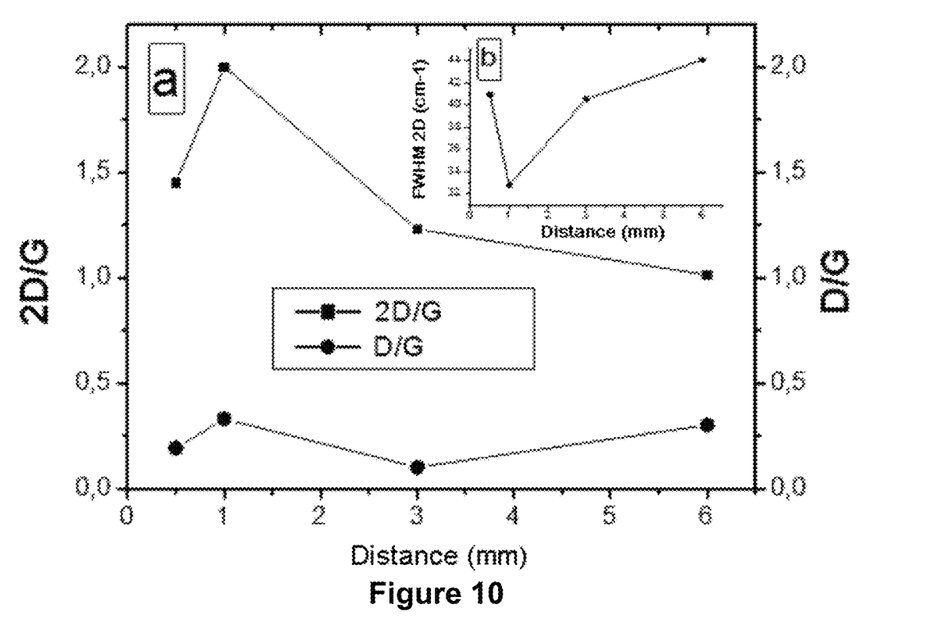
FIG. 10 shows the distance variation in the sheet gap during the synthesis as a function of 2D/G, D/G, and a curve "b" is inserted therein as a function of FWHM.

FIG. 10 shows the gap distance variation between the sheets during synthesis as a function of 2D/G, D/G, in curves "a", and a in the curve "b" insert, as a function of FWHM, wherein the synthesis exposure times are 10 min, synthesis temperature of 970° C., and flow rates of 1 and 0.1 L/min Argon and Methane, respectively. The 532-nm Raman spectra are obtained directly in one of the copper sheets' inner surface in nine different locations, thus its respective 2D/G, D/G, and FWHM ratios being obtained to finally be averaged, thus an optimal gap distance of about 1 mm being observed.

What is claimed is:

1. A method for producing graphene on a copper substrate by modified chemical vapor deposition, comprising: providing two copper sheets arranged in a parallel manner and separated by a ceramic material; incorporating said two copper sheets into an open chamber that is constituted by a glass cylindrical chamber, wherein its axial axis is directed vertically, wherein the glass cylindrical chamber is totally open in its lower surface; heating the two copper sheets by using an electromagnetic induction heater at a predetermined temperature; providing a mixture of Methane and Argon streams in the upper surface of said glass cylindrical chamber; continually monitoring the temperature of the two copper sheets by using a radiation pyrometer through a quartz window arranged in the upper surface of the glass cylindrical chamber; heating said two copper sheets to about 1,000° C. by using an electromagnetic induction heater for a predetermined period of time; and cooling down to room temperature with the same Methane and Argon streams.

2. The method for producing graphene according to claim 1, wherein the two copper sheets, arranged inside the glass cylindrical chamber, are 30 mm diameter and 0.1 mm thickness with 99.8% purity, are also arranged in a parallel, separated manner, and supported by three ceramic pillars, of 3.5 mm diameter and 30 mm long, that are fixed to a base also made of the same material.

3. The method for producing graphene according to claim 1, wherein the electromagnetic induction heater consists of a coil that externally is disposed around at the glass cylindrical chamber, wherein alternate current as generated by a frequency oscillator, is fed to the coil.

4. The method for producing graphene according to claim 1, wherein prior to their introduction into the glass cylindrical chamber, the two copper sheets are treated with acetic acid for 2 minutes and rinsed with ethanol.

5. The method for producing graphene according to claim 1, wherein the copper sheets are kept under Methane and Argon streams of 1.0 L/min and 0.1 L/min, respectively, for 2 minutes.

6. The method for producing graphene according to claim 1, wherein by cooling down with the same Methane and Argon streams, the cooldown reduction is 1,000° C. to 600° C. in about 5 seconds.

7. The method for producing graphene according to claim 1, wherein the predetermined period of time for heating to about 1000° C. by using an electromagnetic induction heater is 15 minutes.

8. The method for producing graphene according to claim 1, wherein the glass cylindrical chamber has a with a 40 mm diameter and is 110 mm long.

9. A system for producing graphene on a copper substrate by modified chemical vapor deposition , comprising two copper sheets arranged in a parallel manner and separated by a ceramic material; said two copper sheets incorporated into an open chamber that is constituted by a glass cylindrical chamber, wherein its axial axis is directed vertically, wherein the glass cylindrical chamber is totally open in its lower surface; an electromagnetic induction heater at a predetermined temperature to heat the two copper sheets and for a predetermined period of time; a provision of a mixture of Methane and Argon streams in the upper surface of said glass cylindrical chamber; and a radiation pyrometer to continually monitor the temperature of the two copper sheets through a quartz window arranged in the upper surface of the glass cylindrical chamber.

10. The system for producing graphene according to claim 9, wherein the predetermined temperature to heat the two copper sheets arranged in a parallel manner and separated by a ceramic material by using the electromagnetic induction heater is 1,000° C.

11. The system for producing graphene according to claim 9, wherein the two circular copper sheets, arranged inside the glass cylindrical chamber, are 30 mm diameter and 0.1 mm thickness with 99.8% purity, are also arranged in a parallel, separated manner, and supported by three ceramic pillars, of 3.5 mm diameter and 30 mm long, that are fixed to a base also made of the same material.

12. The system for producing graphene according to claim 9, wherein the electromagnetic induction heater consists of a coil that is disposed around the glass cylindrical chamber, wherein alternate current as generated by a frequency oscillator, is fed to the coil.

13. The system for producing graphene according to claim 9, wherein prior to their introduction into the glass cylindrical chamber, the two copper sheets are treated with acetic acid for 2 minutes and rinsed with ethanol.

14. The system for producing graphene according to claim 9, wherein the provision of the Methane and Argon streams is 1.0 L/min and 0.1 L/min, respectively, for 2 minutes.

15. The system for producing graphene according to claim 9, wherein the predetermined period of time for heating to about 1,000° C. by using an electromagnetic induction heater is 15 minutes.

16. The system for producing graphene according to claim 9, wherein the glass cylindrical chamber has a 40 mm diameter and is 110 mm long.

* * * * *